United States Patent [19]

Chen et al.

[11] Patent Number: 5,802,264
[45] Date of Patent: Sep. 1, 1998

[54] BACKGROUND DATA RECONSTRUCTION IN A STORAGE DEVICE ARRAY SYSTEM

[75] Inventors: Joseph Chen, Westminster; Kenneth Lau, Longmont, both of Colo.

[73] Assignee: Fujitsu Limited, Kawasaki, Japan

[21] Appl. No.: 792,729

[22] Filed: Nov. 15, 1991

[51] Int. Cl.$^6$ .................................................. G06F 11/00
[52] U.S. Cl. ........................... 395/182.04; 395/182.05; 371/10.2
[58] Field of Search .................. 395/182.03, 182.04, 395/182.05; 371/10.2; 364/238.4, 236.2, 243, 245, 245.3, 260, 260.1, 260.2, 260.3, 264.7, 265.1, 265.5, 268.3, 268.5, 268.6, 268.8, 268.9

[56] References Cited

U.S. PATENT DOCUMENTS

| | | | |
|---|---|---|---|
| 4,899,342 | 2/1990 | Potter et al. | 371/10.1 |
| 5,072,378 | 12/1991 | Manka | 371/40.1 |
| 5,124,987 | 6/1992 | Milligan et al. | 371/10.1 |
| 5,134,619 | 7/1992 | Henson et al. | 371/11.1 |
| 5,155,845 | 10/1992 | Beal et al. | 371/10.1 |
| 5,159,671 | 10/1992 | Iwami | 371/10.1 |

FOREIGN PATENT DOCUMENTS

| | | |
|---|---|---|
| 0369707 A2 | 5/1990 | European Pat. Off. . |
| 0385836 | 9/1990 | European Pat. Off. . |
| 0482819 A2 | 4/1992 | European Pat. Off. . |
| 0488782 A1 | 6/1992 | European Pat. Off. . |
| WO 91/15822 | 10/1991 | WIPO . |

OTHER PUBLICATIONS

R.R. Muntz and J.C.S. Lui, "Performance Analysis of Disk Arrays Under Failure," Proceedings of the 16th International Conference on Very Large Data Bases, Brisbane, Australia, Aug. 13–16, 1990, (1989) Palo Alto, California, pp. 162–173.

*Primary Examiner*—Hoa T. Nguyen
*Attorney, Agent, or Firm*—Sheridan Ross P.C.

[57] ABSTRACT

The present invention provides a storage device array system and method for operating a storage device array system that provides for data transfers to and/or from a storage device array during the reconstruction of data contained in a failed storage device onto a spare storage device. One embodiment of the invention provides for data transfers during the reconstruction of data on the spare storage device onto a storage device that is replacing the failed storage device. Another embodiment of the invention is directed to the situation in which data contained in a storage device to which data can be written and from which data can be read but these operations are inhibited is being reconstructed on a spare storage device using other of the storage devices in the array. In this situation, write operations to the storage device array are conducted in a manner that provides fault-tolerance, i.e., the ability to continue the reconstruction process, in the event one of the other storage devices being used to reconstruct the data on the spare storage device cannot provide the necessary data for reconstruction.

38 Claims, 8 Drawing Sheets

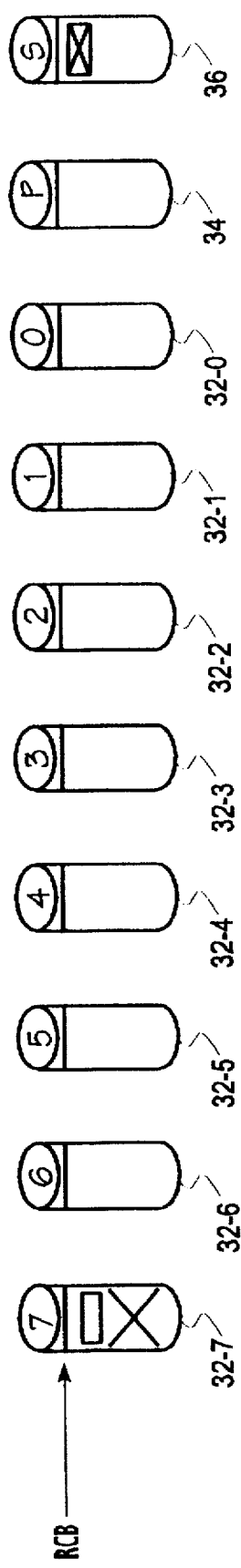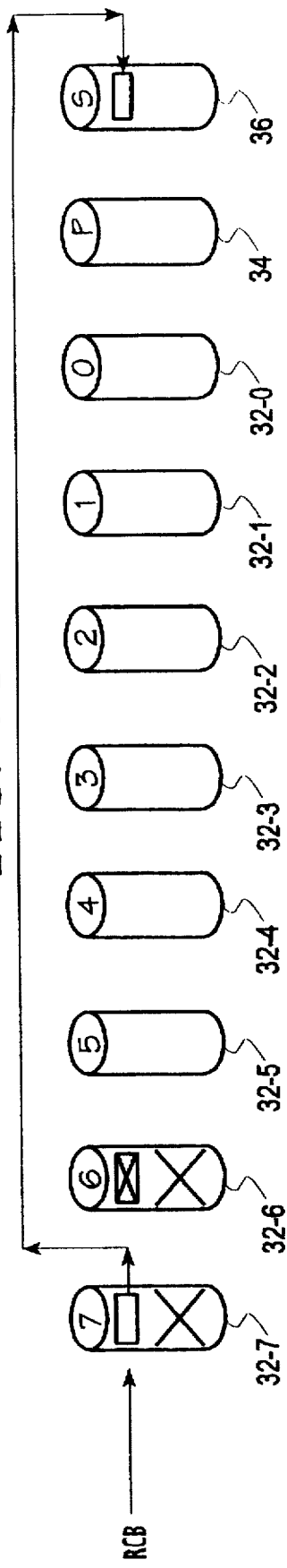

BACKGROUND DATA RECONSTRUCTION IN A STORAGE DEVICE ARRAY SYSTEM

BACKGROUND OF THE INVENTION

1. Field of the Invention

The present invention relates to storage device array systems. In particular, the present invention is directed to a storage device array system and a method for operating a storage device array system that provides for data transfers to and/or from a storage device array during the reconstruction of data contained in a storage device that is in a failed condition onto a spare storage device. Moreover, the present invention relates to a system and method that provides for write operations during reconstruction which conducts the write operations so that the reconstruction operation is fault-tolerant, i.e., can proceed even if a fault condition should occur that would otherwise inhibit reconstruction.

2. Description of the Related Art

The typical computer system includes a host processor or central processing unit (CPU) and one or more mass storage devices. The mass storage device is generally used to store the programs that the host processor executes, the data upon which the program operates when executing, or the data produced as a result of executing the program.

One of the more popular mass storage devices is the disk drive. The disk drive includes at least one disk that is adapted to store digital information that, at present, can be accessed either magnetically or optically. The digital information is in the form of bits, which can either be in a "0" or a "1" state. The bits are commonly grouped into bytes of eight bits. Typically, the data is stored on concentric tracks that are subdivided into sectors. Each sector is capable of storing a number of bytes of data that is generally referred to as a block. To write data on the disk and read data from the disk, a transducer, which is typically referred to as a read/write (R/W) head, is included in the disk drive. Generally, the R/W head can be moved so that it can be positioned over a desired track on the disk. To move the disk relative to the R/W head, so that data can be transferred between a track and the R/W head, a motor is included in the disk drive to rotate the disk about its center point. More specifically, the motor rotates the disk at a substantially constant angular velocity relative to the R/W head. As the disk rotates, bytes of data are serially transferred between the R/W head and the disk, i.e, transferred one at a time. The rate at which data can be transferred between the disk and the R/W head is dependent upon the density at which data can be established on the disk. Additionally, the data transfer rate is dependent upon the rotational velocity of the disk as determined by the motor.

While the density at which data can be recorded on a disk has increased, and as a consequence, the data transfer rate for a given rotational velocity of the disk has increased, such increases in data density are relatively infrequent. Consequently, for a given data density, the rotational velocity of the disk is determinative of or limits the data transfer rate of the disk drive.

Many host processors are now capable of transferring data at much higher rates than disk drives are capable of transferring data. As a result, the disk drives used in these computer systems have limited the overall performance of the system. To circumvent this performance limitation, disk drive storage systems have been proposed in which an array of disk drives is used to achieve parallel data transfers of related data at a higher rate than is attainable with a comparable single disk drive. For example, in a disk drive array storage system that includes eight disk drives, eight bytes of related data can be written in parallel to the disk array so that one byte of the related data is located in each of the eight disk drives comprising the disk array. Similarly, these eight bytes of data can be read in parallel when desired. In contrast, the same eight bytes of data would have to be written onto, or read from, a disk drive with one disk and one R/W head one byte at a time or serially.

While disk array storage systems provide improved data transfer rates, they are not without their problems. One type of problem of particular concern is when data cannot be read from one of the disk drives in the array. Since related data is distributed among the disk drives comprising the array, the inability to read data from one disk drive typically renders meaningless the related data from the other disk drives in the array. To address this problem, various schemes have been proposed for reconstructing the data contained on the failing disk drive onto a spare disk drive that, when reconstruction is complete, takes the place of the failed disk drive. Reconstruction of data contained on the failing disk drive is possible because during the process of distributing and writing the related data on the disk drives of the array, parity data is generated and typically written to a disk drive that is part of the disk drive array. Parity data is data that represents the relationship among a group of related data, such as the eight bits that form a byte or group of bytes, and makes possible the reconstruction of data should any one of the related group of data be inaccessible. In the case of a disk drive array system, if data contained in one of the disk drives in the array cannot be read, the data can be reconstructed, provided the parity data and all of the other related data that was used to generate the parity data are available.

Reconstruction, which commonly involves reconstruction of all of the data contained in a failing disk drive onto a spare disk drive, is a very time-consuming process. Moreover, presently known disk drive array systems do not provide for data transfers between the disk array system and the host processor during reconstruction. As a result, when a reconstruction is in progress, the performance of a computer system that requires data transfers between the disk drive array system and the host processor is adversely affected. There is therefore a need for a storage device array system that allows data transfers during the reconstruction process and, as a consequence, improves the overall performance of the computer system during reconstruction.

With respect to both write and read data transfer operations occurring during the reconstruction process, there are several concerns. Namely, it is desirable that the data transfer operation not unduly extend the time for reconstruction. Moreover, accommodating data transfer operations during reconstruction should be a relatively uncomplicated process and not require an undue amount of overhead to support. Furthermore, it is desirable that the reconstruction operation be suspended following the lapse of a specified time period so that the host processor can be assured of access to the storage device array system on a relatively regular basis.

With respect to write data transfers during reconstruction, there is the further concern that the write data transfer operation be conducted in a manner that provides fault-tolerance for the reconstruction operation, i.e., allows reconstruction to continue even though a fault has occurred which would otherwise prevent reconstruction from continuing.

Based on the foregoing, there is a need for a storage device array system and method for using such a system that provides for data transfers during the reconstruction. Moreover, the data transfer operations provided during reconstruction should not significantly impact the overall time required for reconstruction, be relatively uncomplicated, and not require an excessive amount of overhead. In addition, there is a need for data transfer operations during reconstruction on a relatively regular basis. Furthermore, it is desirable that write operations conducted during reconstruction be done in a manner that allows reconstruction to proceed in the presence of a fault condition that would otherwise prevent reconstruction.

SUMMARY OF THE INVENTION

An object of the present invention is to provide a storage device array system and method for operating a storage device array system that provides for data transfers between the system and devices exterior to the system, such as a host processor, while data contained on one of the storage devices in the array is being reconstructed onto another storage device in the array.

Another object of the present invention is to provide for data transfers during reconstruction in a storage device array system that do not substantially extend the time required for the reconstruction operation.

Yet another object of the present invention is to provide for data transfers between a storage device array system and a host processor or similar device during reconstruction that are relatively uncomplicated and readily implemented.

A further object of the present invention is to provide a storage device array system that is capable of conducting data transfers with a host processor or similar device during reconstruction that requires relatively little overhead to implement.

Yet a further object of the present invention is to provide a storage device array system that provides for data transfers between the system and a host processor or similar device during reconstruction which permits the host processor to conduct such transfers on a relatively regular basis.

Yet another object of the present invention is to provide a storage device array system that provides for write data transfers between a host processor and the system during a reconstruction operation that is fault-tolerant.

The storage device array system of the present invention includes a plurality of storage devices with each device being in either an operable state in which data can be written to and read from the storage device, and a failed state in which such data transfers are inhibited. The system further includes a spare storage device for use in replacing one of the plurality of storage devices that is in a failed state. The plurality of storage devices and the spare storage device comprise a storage device array. The system further includes a device for controlling the transfers of data to and from the storage device array that provides the ability to reconstruct data contained in one of the plurality of storage devices that is in a failed state onto the spare storage device and, while reconstruction is occurring, further provides for data transfers between the storage device array system and a host processor or similar device.

One embodiment of the storage device array system is adapted to accommodate the situation in which the storage device whose data is being reconstructed on the spare storage device is in a failed state in which data can still be written to and read from the storage device but only with difficulty. For example, data may be read from the storage device but only if error recovery procedures are implemented. A storage device that is capable of these types of data transfers is hereinafter referred to as a failed/usable storage device. In this situation, the device for controlling the transfers of data between the storage device array and the host processor conducts write operations so that the reconstruction of data contained on the failed/usable drive onto the spare disk drive can proceed in a predetermined sequence. The reconstruction process generally proceeds in a defined sequence in which the locations of the data on the failed storage device that is currently being reconstructed on the spare storage device and the comparable location on the spare storage device are identified by a reconstruction boundary. Data on the failed drive that is in the sequence prior to the reconstruction boundary has, by definition, been reconstructed. Conversely, data on the failed drive located at a point in the sequence that is after the reconstruction boundary has not been reconstructed. The device for controlling data transfers conducts write operations in which data is to be written prior to the reconstruction boundary so that data destined for the failed/usable storage device is written to the spare storage device. (The data is written in the same manner when the storage device whose data is being reconstructed on the spare storage device is in a failed state in which it is unusable.) By writing this data to the spare storage device, the need to keep track of the location at which the data was written to the storage device array so that the data destined for the failed/usable disk drive can be, at some point, reconstructed on the spare drive is avoided. As a consequence, the write operation is supported during reconstruction in a manner that does not substantially extend the time for reconstruction, is relatively uncomplicated, and requires relatively little overhead.

With respect to write operations in which data is written to the storage device array at a location after the reconstruction boundary, the device for controlling data transfers takes advantage of the failed/usable status and writes data to the failed/usable storage device. Consequently, when the reconstruction process takes place at the location where the write operation occurred, the data in the failed/usable drive is current and can be used to keep the reconstruction process going in the event that the other storage devices cannot be used to reconstruct the data in the failed/usable storage device. In one embodiment, the data in the failed/usable drive is copied to the spare drive when one or more of the other storage devices are incapable of providing the necessary information for reconstruction of data on the failed/usable storage device.

To avoid keeping track of whether write operations occur prior to or after the reconstruction boundary during the reconstruction of the data on a failed/usable storage device, a further embodiment of the invention employs a device for controlling the transfers of data that writes identical data to both the failed/usable storage device and the spare storage device. Consequently, the benefits noted with respect to write data transfers prior to, and after, the reconstruction boundary and the further benefit of not having to determine whether the transfer was before or after the reconstruction boundary are realized. Preferably, the writing of identical data to both the failed/usable storage device and the spare storage device is accomplished substantially simultaneously. This avoids the situation in which data in the failed/usable storage device is not current and the aforementioned fault condition occurs. If this were the case, reconstruction could not proceed.

Another embodiment of the storage device array system of the present invention employs a device for controlling data transfers to and from the storage device array during reconstruction that conducts read data transfer operations by monitoring the location of the reconstruction boundary and conducting the read data transfer based upon whether the transfer is before or after the reconstruction boundary. Read operations prior to the reconstruction boundary are conducted by reading the data in the plurality of storage devices other than the failed/usable storage device and the data in the spare storage device, which contains, prior to the reconstruction boundary, the reconstructed data from the failed/ usable storage device. (The data is read in the same manner when the storage device whose data is being reconstructed on the spare storage device is in a failed state in which it is unusable.) With respect to read operations at locations that are after the reconstruction boundary, the device for controlling transfers conducts the read operation such that data is read from the failed/usable storage device, thereby taking advantage of its failed/usable status, and the plurality of storage devices other than the failed/ usable storage device. Thus, the storage device array system conducts read data transfers between the storage device array and the host processor in a manner that is relatively uncomplicated, that does not require a great deal of overhead, and does not substantially increase the overall time necessary for a reconstruction operation to be completed.

A further embodiment of the invention provides for relatively regular data transfers between the storage device array system and a host processor during the reconstruction process. Specifically, the means for controlling transfers of data is provided with a predetermined time interval during which reconstruction can occur and after which reconstruction, if not complete, is suspended so that the host can access the storage device array for data transfer operations. Consequently, during the relatively lengthy process of reconstruction, the host processor is provided with access to the storage device array for data transfer operations on a relatively regular basis.

BRIEF DESCRIPTION OF THE DRAWINGS

FIGS. 7A–7C illustrate the fault-tolerance of the present invention in the situation in which a write operation during reconstruction occurs at a location prior to the reconstruction boundary and there is a subsequent power failure that requires reconstruction to begin anew.

DETAILED DESCRIPTION OF AN EMBODIMENT OF THE INVENTION

Figure 1:
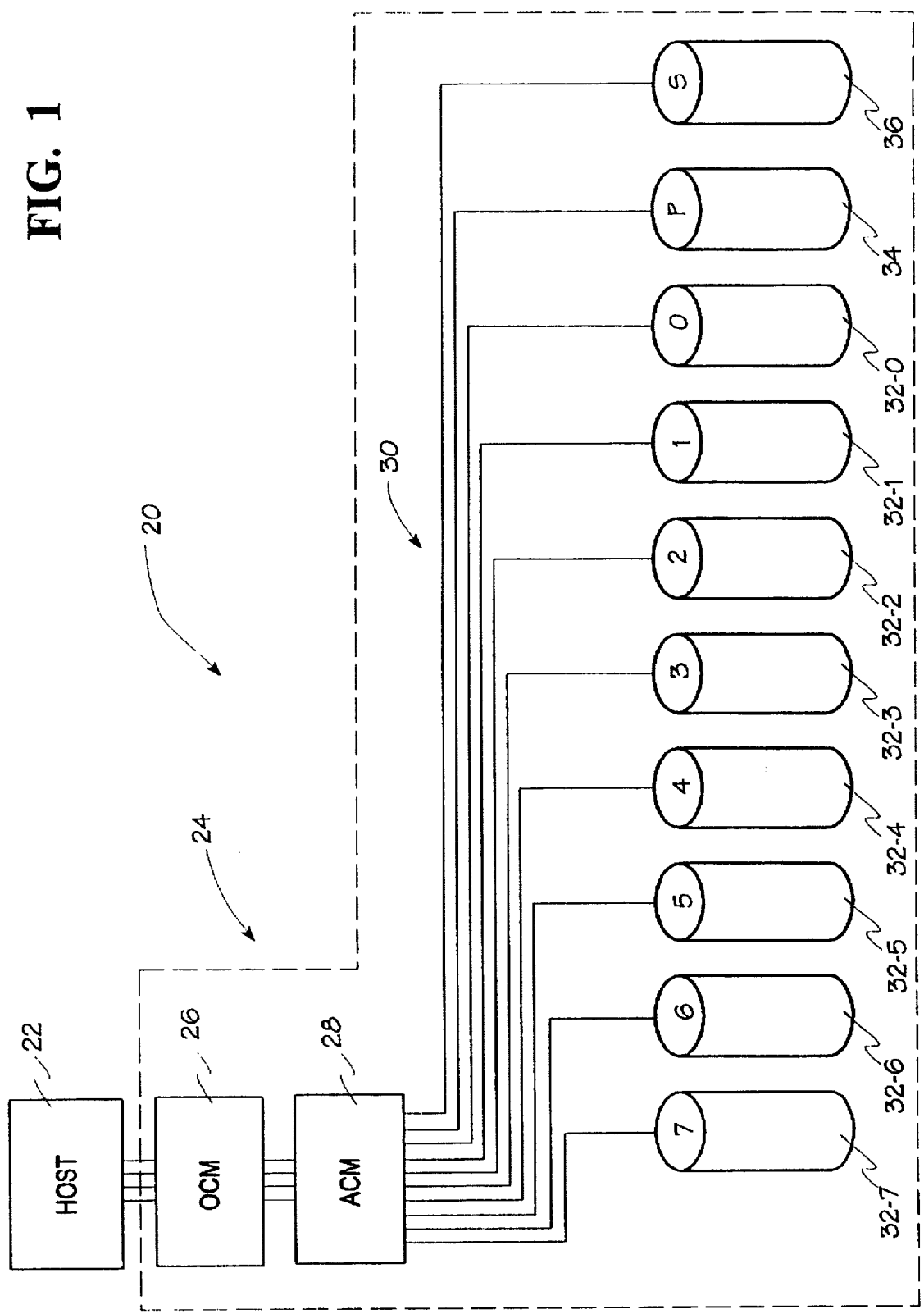
FIG. 1 is a block diagram of a computer system that includes a host processor and a disk storage array system that embodies the present invention.

FIG. 1 illustrates a computer system 20 that includes a host processor or CPU 22 and a disk drive array system 24 that transfers data to and from the host processor 22. The two types of data transfers that can occur between the host processor 22 and the disk drive array system 24 are write data transfers and read data transfers as viewed from the perspective of the host processor 22. More specifically, write data transfers are data transfers from the host processor 22 to the disk drive array system 24. Read data transfers are transfers of data from the disk drive array system 24 to the host processor 22. Data transfers between the host processor 22 and the disk drive array system 24 occurs over an optical communication link that transfers data at a rate of 36 Mb/s.

The disk drive array system 24 includes an optical control module (OCM) 26 for processing data transfers with the host processor 22 over a four byte wide optical communication link. The OCM 26 operates to convert the data transferred over the optical communication link between optical data and electrical data. More specifically, in the case of a write data transfer, the OCM 26 converts optical data provided by the host 22 into electrical data. Conversely, in the case of a read data transfer, the OCM 26 converts electrical data into optical data for transmission to the host 22.

The disk drive array system 24 also includes an array control module (ACM) 28 for use in controlling data transfers between the OCM 26 and a disk drive array 30. Among other things, the ACM 28 demultiplexes the user data provided by the OCM 26 into eight byte-wide channels that each operatively communicate with a separate disk drive of the disk drive array 30 in the case of write operations. During read operations, the ACM 28 multiplexes data provided by the eight channels for transmission over the four channels to the OCM 26.

The disk drive array 30 further includes disk drives 32-0 through 32-7 for, during normal operation, storing data written to the disk drive array 30 by the host processor 22 and providing data to the host processor 22 during read operations. The disk drive array 30 further includes a parity disk drive 34 for containing parity data relating to the user data stored in the disk drives 32-0 through 32-7. Parity data is data that is representative of a relationship between related data stored in each of the disk drives 32-0 through 32-7 and can be used to reconstruct data contained on one of the disk drives 32-0 through 32-7 should such data be unavailable. For example, suppose eight bytes of related user data are written to the disk drive array 30 so that one byte of the eight bytes is located on each of the disk drives 32-0 through 32-7 and a parity byte for the eight bytes of related user data being located on the parity disk drive 34. Further suppose that upon attempting to read all of the related data from the disk drives 32-0 through 32-7, the disk drive 32-7 is incapable of providing its byte of the related eight bytes of user data. In this case, the related user data contained in the disk drives 32-0 through 32-6 and the parity byte contained in the parity disk drive 34 can be used to reconstruct the byte of the related data that is contained in the disk drive 32-7. The disk drive array 30 also includes a hot spare disk drive 36, which is hereinafter referred to simply as the spare disk drive 36, for replacing one of the disk drives 32-0 through 32-7 and the parity disk drive 34 should one of these disk drives fail.

The "hot" term indicates that the disk in the spare disk drive 36 has been spun up to the nominal rotational velocity and that the spare disk drive 36 is capable of processing data transfers. Each of the disk drives 32-0 through 32-7, 34, and 36 can be comprised of a plurality of physical drives, as illustrated.

Figure 2:
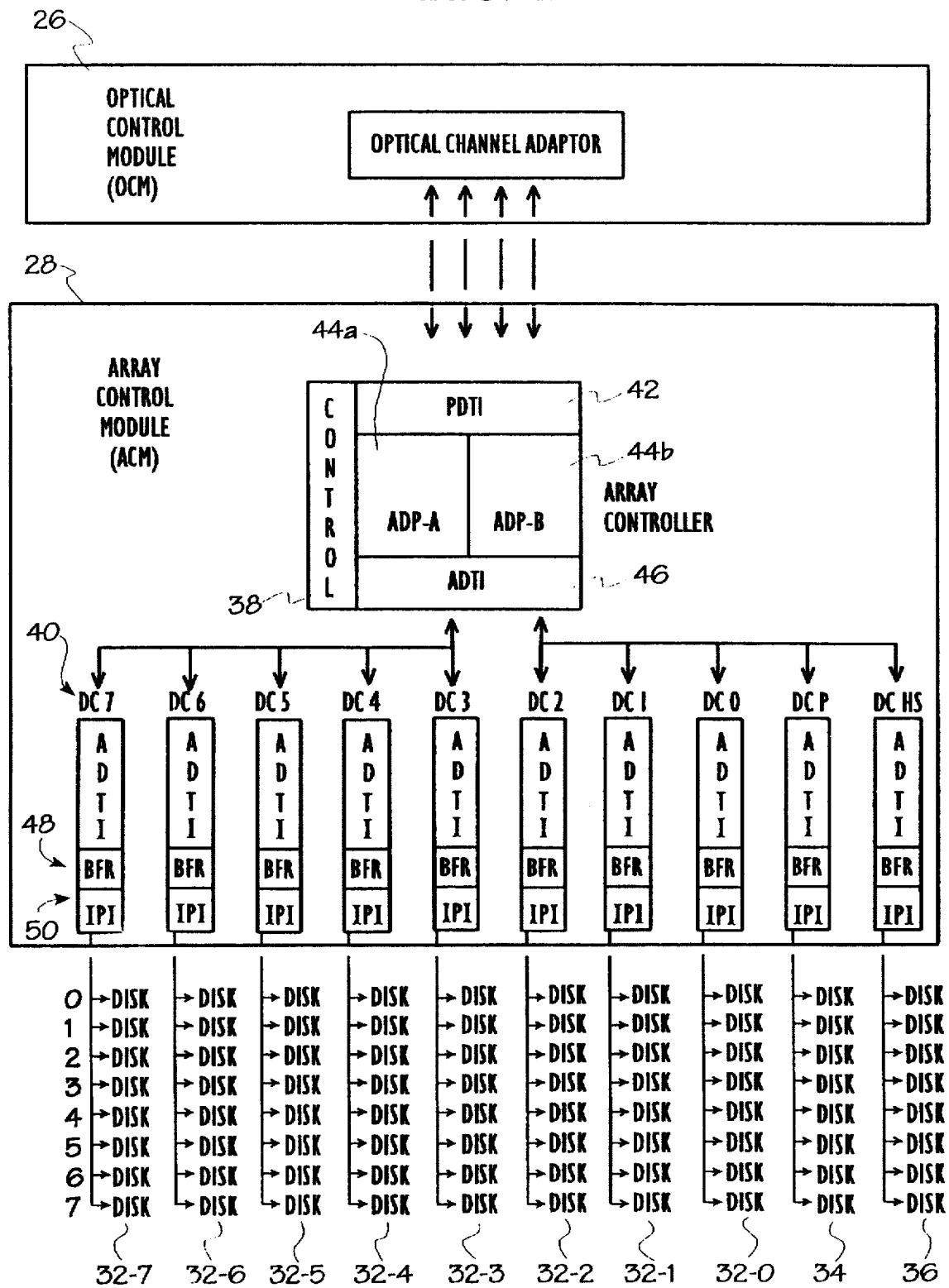
FIG. 2 is a block diagram of the array control module that is shown in FIG. 1 and that is used to facilitate data transfers between the host processor and the disk drive array.

With reference to FIG. 2, the array control module 28 includes an array controller 38 for processing commands issued by the host processor 22 and, in so doing, coordinating the operation of a plurality of device controllers 40. Each of the device controllers 40 is associated with one of the disk drives in the disk drive array 30 and operates pursuant to the instructions issued by the array controller 38 to control the operation of its disk drive. The array controller 38 includes a parallel data transfer interface (PDTI) 42 for demultiplexing and multiplexing data during write and read operations, respectively. The PDTI 42 also generates parity data for the user data provided by the host processor 22 during write operations. The parity data is written to the parity disk drive 34 as part of the write operation. The PDTI 42 includes a first array data processor A (ADPA) 44A and a second array data processor B (ADPB) 44B that are used to demultiplex data during write operations, and multiplex user data during read operations. Specifically, the ADPA 44A and the ADPB 44B each demultiplex data provided by two of four byte-wide interfaces that extend between the OCM 26 and the ACM 28 during write operations. Conversely, the ADPA 44A and the ADPB 44B multiplex four bytes of data provided by four of the disk drives in the disk drive array for transmission over two of the byte-wide interfaces that extend between the OCM 26 and the ACM 28 during read operations. In addition, the ADPA 44A generates parity data during write operations that is subsequently written to the parity disk drive 34.

In operation, the ADPA 44A and the ADPB 44B, during write operations, demultiplex a 4 kB block of data provided by the OCM 26 into eight 512 byte blocks. In addition, the ADPA 44A generates a 512 byte parity block. During read operations, the ADPA 44A and the ADPB 44B multiplex eight 512 byte blocks provided by the disk drives 32-0 through 32-7 into a four kB block for transmission across the four byte-wide interface to the OCM 26.

The device controllers 40 each include an automatic data transfer interface (ADTI) for, among other things, conducting error processing during read and write data transfers between the device controller 40 and one of the disk drives in the disk drive array 30. In addition, each of the device controllers 40 includes a one track buffer 48 that allows for variations in drive speed, loss of spindle synchronization between the drives, slipped blocks and defective block processing. Transfers between each of the device controllers 40 and one of the disk drives in the disk drive array 30 is accomplished via an intelligent peripheral interface (IPI-2) 50.

A normal write data transfer between the host processor 22 and the disk drive array system 24, in which user data is written to the disk drives 32-0 through 32-7 and the parity disk drive 34, is initiated by the host processor 22 issuing a LOCATE command to the disk drive array system 24. The LOCATE command causes the R/W heads in the disk drives 32-0 through 32-7 and the parity disk drive 34 to be positioned over corresponding locations on the disks contained therein so that, when user data is provided by the host processor 22, the data will be distributed to corresponding locations in the disk drives 32-0 through 32-7. Processing of the LOCATE command by the disk drive array system 24 is primarily accomplished by the array controller 38 after being passed through by the OCM 26. More specifically, the array controller 38 issues the necessary commands to the device controllers 40 for positioning the R/W heads in the disk drives 32-0 through 32-7 and the parity disk drive 34 at corresponding locations over the disks contained in the disk drives. In response, the device controllers 40 issue the necessary instructions to the disk drives 32-0 through 32-7 and the parity disk drive 34 to initiate the required positioning of the R/W heads. Once the R/W heads are properly positioned, each of the disk drives 32-0 through 32-7 and the parity disk drive 34 indicates that proper positioning has been attained to the device controllers 40. This indication is relayed to the array controller 38 which, in turn, relays the indication of proper positioning to the host processor 22.

After the disk drive array system 24 indicates to the host processor 22 that the LOCATE command has been successfully completed, the host processor 22 issues a WRITE command to the disk drive array system 24. The OCM 26 passes the WRITE command on to the ACM 28. Processing of the WRITE command by the ACM 28 is initially accomplished by the array controller 38. The array controller 38 issues the necessary commands to the device controllers 40 which, in turn, issue the necessary commands over the IPI-2 50 to the disk drives 32-0 through 32-7 and the parity disk drive 34 for accomplishing the write operation. The disk drives 32-0 through 32-7 and the parity disk drive 34 then indicate to the ACM 28 when each is ready to process the WRITE command, i.e., write data to the disks. The ACM 28 then indicates to the host processor 22 via the OCM 26 that the disk drive array system 24 is ready to process the WRITE command.

Upon being informed by the disk drive array system 24 that writing of data can commence, the host processor 22 begins to transfer user data over the optical data interface to the OCM 26. The OCM 26 provides the data to the ACM 28 over the four byte-wide interface. In response, the PDTI 42 and, specifically, the ADPA 44A and the ADPB 44B demultiplex the data onto the interfaces for each of the device controllers 40. In addition, the ADPA 44A generates the parity data for the user data that is to be written on the parity disk drive 34. The user data is then distributed to the device controllers 40 for the disk drives 32-0 through 32-7 and the parity data generated by the ADPA 44A is distributed to the device controller 40 for the parity disk drive 34. The device controllers 40 for the disk drives 32-0 through 32-7 and the parity disk drive 34 then transfer bytes of data over their respective IPI-2 50 to the disk drives 32-0 through 32-7 and the parity disk drive 34. Consequently, at any one time, eight bytes of related user data and one byte of parity data are substantially simultaneously transferred from the ACM 28 to the disk drive array 30 and are distributed such that one byte of user data is located in each of the disk drives 32-0 and 32-7 and a corresponding parity byte is transferred to the parity disk drive 34. The transfer of data between the host processor 22 and the disk drive array system 24 as described hereinabove continues until the write operation, as defined by the host processor 22, is complete.

The normal read operation in which user data is read from the disk drives 32-0 through 32-7 and parity data is read from the parity disk drive 34 to verify the accuracy of the user data is initiated by host processor 22 issuing a LOCATE command to the disk drive array system 24. This results in the R/W heads of the disk drives 32-0 through 32-7 and the parity disk drive 34 being positioned over the corresponding locations on their respective disks at which the desired information is located. The processing of a LOCATE command by the ACM 28 is substantially identical to that described with respect to a write data transfer. Once the disk drive array system 24 indicates to the host processor 22 that the LOCATE command has been completed, the host processor 22 issues a READ command to the disk drive array system 24. The READ command is passed by the OCM 26 to the ACM 28. In response, the array controller 38 of the ACM 28 issues the necessary instructions to the device controllers 40 for the disk drives 32-0 through 32-7 and the parity disk drive 34. Subsequently, the device controllers 40 transmit the requisite information to the disk drives 32-0 through 32-7 and the parity disk drive 34 over the IPI-2 interfaces 50 to commence the parallel transfer of user data from the disk drives 32-0 through 32-7 and parity data from the parity disk drive 34 to the ACM 28. Upon receipt of the user and parity data from the disk drives 32-0 through 32-7 and the parity disk drive 34, respectively, the ACM 28 uses the parity data to confirm the integrity of the user data. If no errors are detected, the ACM 28 appropriately multiplexes the data for transmission to the OCM 26 over the four byte-wide interface. The OCM 26 then transfers the data to the host processor 22 over the optical communication link. This process continues until the READ command is complete.

Disk drives, like any other device, are subject to failure. In the worst case, user data cannot be written to or read from the disk drive. Such disk drives are hereinafter referred to as failed disk drives. At the other end of the failure spectrum, user data can be written to and read from a disk drive but the data transfer is in some way inhibited. An example of an inhibited data transfer operation is a case in which data can be read from a disk drive but the process of reading the user data requires the implementation of error recovery procedures. Disk drives in which the transfers of data are inhibited are hereinafter referred to as failed/usable disk drives. The failure of a disk drive in a disk array is of particular concern because of the relationship between the data distributed among the disk drives comprising the disk array. For example, if eight bytes of data that define a person's name are distributed among the disk drives 32-0 through 32-7 such that one byte is located in each of the disk drives 32-0 through 32-7 and the byte in disk drive 32-7 cannot be read, then the remaining bytes in disk drives 32-0 through 32-6 are essentially rendered meaningless.

To address the possibility of a disk drive failure in the disk drive array system 24, the ACM 28 has been adapted to implement a reconstruction process in which data on a failed disk drive is reconstructed using the data contained in the disk drives that are operable and the parity data, and then written to the spare disk drive 36. Reconstruction is a process that occurs in a defined sequence. For example, reconstruction can be begin with the data located beginning at track 0, sector 0 of each of the disk drives and proceed according to increasing sector numbers and then increasing track numbers. However, reconstruction can occur in any desired sequence. In any event, the current location in the disk drive array at which reconstruction is occurring is identified as the reconstruction boundary (RCB). The data in the reconstruction sequence that are prior to the reconstruction boundary have, by definition, been reconstructed on the spare disk drive 36. Data in the reconstruction sequence that follow the reconstruction boundary have, by definition, not been reconstructed on the spare disk drive 36.

Figure 3:
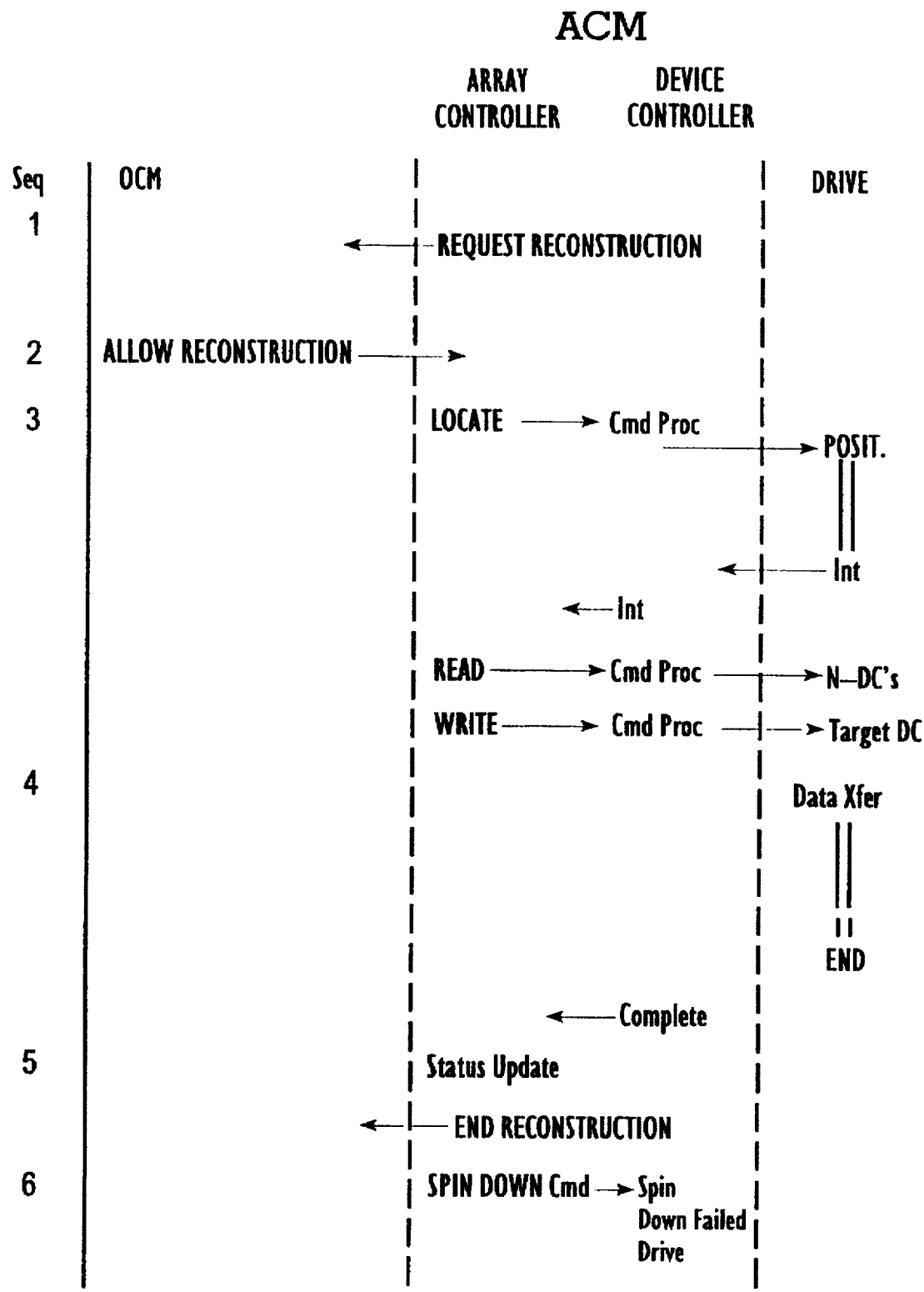
FIG. 3 illustrates the sequence of operations that occur in the disk storage array system shown in FIG. 1 during the reconstruction of data contained in a failed disk drive onto a spare disk drive.

With reference to FIG. 3, the reconstruction process implemented by the ACM 28 is illustrated. Initially, the ACM 28 recognizes that one of the disk drives 32-0 through 32-7 or the parity disk drive 34 has failed and indicates to the host processor 22, via the OCM 26, that it desires to implement the reconstruction process. The host processor 22, in response, indicates to the ACM 28 that he reconstruction operation is acceptable. The array controller 38 in the ACM 28 then issues a LOCATE command that is distributed to command processors in each of the device controllers 40 to position the R/W heads in each of the disk drives 32-0 through 32-7, the parity disk drive 34, and the spare disk drive 36 at the initial data location in the reconstruction sequence. The command processors in each of device controllers 40, in turn, issue the appropriate instructions to the disk drives 32-0 through 32-7, the parity disk drive 34, and the spare disk drive 36 to cause the R/W heads to be positioned at the initial location in the reconstruction sequence.

Once all of the R/W heads in the disk drives 32-0 through 32-7, the parity disk drive 34, and the spare disk drive 36 have been properly positioned, the array controller 38 in the ACM 28 issues a READ command to the command processors in all of the device controllers 40 except for the failed disk drive and the spare disk drive on which the data in the failed disk drive is to be reconstructed. For example, if the disk drive 32-7 is the failed disk drive, then the process controller issues a READ command to the device controllers for the disk drives 32-0 through 32-6 and the parity disk drive 34. The command processors in each of the device controllers 40 that receives a READ command then takes the necessary action to cause the data at the initial data location in the reconstruction process to be read.

After the data from the operable disk drives and the parity disk drive 34 has been read, the ACM 28 uses this data to reconstruct the data on the failed disk drive. Continuing with the above example, the user data from the disk drives 32-0 through 32-6 and the parity disk drive 34 is used by the ACM 28 to reconstruct the data on the failed disk drive 32-7.

Once the data on the failed disk drive has been reconstructed, the array controller 38 in the ACM 28 issues a WRITE command to the command processor of the device controller 40 for the spare disk drive 36 so that the reconstructed data can be written to the spare disk drive 36. The command processor of the device controller 40 for the spare disk drive 36 then takes the appropriate actions to cause the reconstructed data to be written to the location at which the R/W head in the spare disk drive 36 is positioned, the initial location in the reconstruction sequence. The process of locating consecutive data locations in the reconstruction sequence, reading the user data from the operable disk drives, reconstructing the data on the failed disk drive from the data read from the operable disk drives, and then writing the reconstructed data to the spare disk drive 36 continues until all of the data on the failed disk drive has been reconstructed on the spare disk drive 36. At this point, the ACM 28 indicates to the host processor 22 via the OCM 26 that reconstruction is complete. The host processor 22 can now conduct normal data transfers with he disk drive array system 24 with the spare disk drive 36 taking the place of the failed disk drive.

Following reconstruction, the failed disk drive is removed from the disk drive array 30 and replaced. Typically, after the failed disk drive is replaced, the data on the spare disk drive 36 is then reconstructed onto the replacement disk drive. Continuing with the foregoing example, once the disk drive 32-7 has been replaced in the disk drive array 30, the data on the spare disk drive 36 is then reconstructed on the disk drive 32-7.

Reconstruction is a very time-consuming process due, in large part, to the number of data transfer operations between the disk drive array 30 and the ACM 28 required to reconstruct all of the data on a failed disk drive. Since the data distributed among the disk drive array 30 is related, an uninterrupted reconstruction of all of the data on a failed disk drive effectively prevents a host processor from conducting any kind of data transfer operation with the disk drive array system during the reconstruction process. The disk drive array system 24 addresses this performance bottleneck by providing the host processor with access to the disk drive array 30 during the reconstruction process. This is achieved by predefining the number of blocks of data that the ACM 28 will reconstruct at any one time. Typically, this number is defined by the host processor 22. Consequently, the host processor 22 is assured of access to the disk drive array 30 on a relatively regular basis during the reconstruction process. In effect, the disk drive array system 24 is capable of interleaving data transfer operations with the reconstruction process. For example, suppose the host processor 22 indicates to the ACM 28 that two blocks are to be reconstructed and then the host processor 22 is to be provided with the opportunity to access the disk drive array 30. In this case, the ACM 28 will conduct the reconstruction process so that two repetitions of the LOCATE, READ, and WRITE sequence illustrated in FIG. 3 are conducted, one for each block, and then allow the host processor 22 to access the disk drive array 30 for a data transfer operation.

Figure 4:
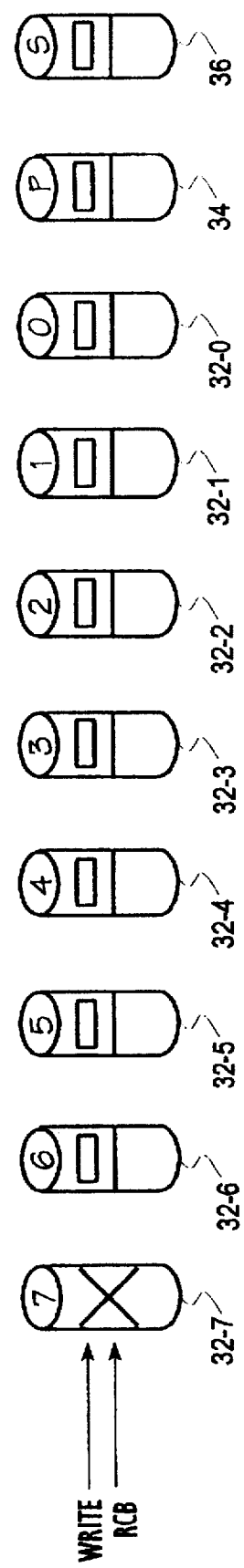
FIG. 4 shows a write operation during reconstruction in which data is written to the disk drive array at a location prior to the reconstruction boundary.

Of particular concern with respect to data transfer operations during reconstruction is that write data transfer operations do not significantly impact the overall time required for reconstruction, be relatively uncomplicated, and not require an excessive amount of overhead to implement. More specifically, it is desired that the write data transfer operation not require the reconstruction process to deviate from a specified reconstruction sequence. In this regard, the ACM 28 implements a write data transfer in which data is written to the disk drive array 30 at a location prior to the reconstruction boundary so that the data that would have been written to the failed disk drive is written to the spare disk drive 36. FIG. 4 illustrates the manner in which the ACM 28 implements a write data transfer operation where the related data is written to a location prior to the reconstruction boundary. In FIG. 4, disk drive 32-7 has failed and the data contained in disk drive 32-7 is being reconstructed on the spare disk drive 36. During reconstruction, the host processor 22 requires a write data transfer operation that would result in data being written to the disk drive array 30 at a location prior to the reconstruction boundary. The ACM 28 implements the write data transfer by writing the data destined for the failed disk drive 32-7 to the spare disk drive 36, the related data to the disk drives 32-0 through 32-6, and the parity data to the parity disk drive 34.

By writing the user data destined for the failed disk drive to the spare disk drive 36, the need for the reconstruction process to keep track of the location at which the write operation occurred is avoided and the reconstruction process can continue in its defined sequence. This is best understood by hypothesizing what would be required of the reconstruction process if the data destined for the failed disk drive 32-7 had not been written to the spare disk drive 36. In this case, the reconstruction process would have to interrupt the reconstruction of the data at the current location of the reconstruction boundary to reconstruct the data destined for the failed disk drive 32-7 onto the spare disk drive 36. Alternatively, the reconstruction process would have to keep track of the location of the write operation and once the defined reconstruction sequence had been completed, return to this location and reconstruct the data destined for the failed disk drive 32-7 onto disk drive 36. Either alternative results in increasing the overall time required for reconstruction, is relatively complicated, or requires an excessive amount of overhead.

Figure 5A:
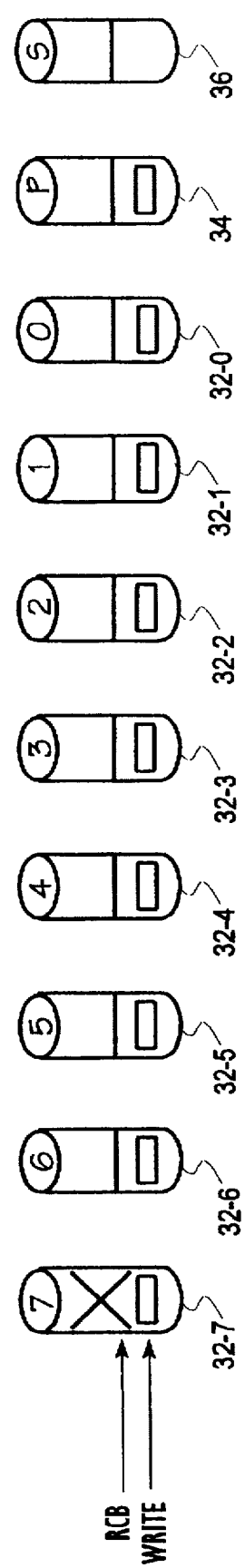
FIG. 5A shows a write operation during reconstruction in which data is written to the disk drive array at a location after the reconstruction boundary.
Figure 5B:
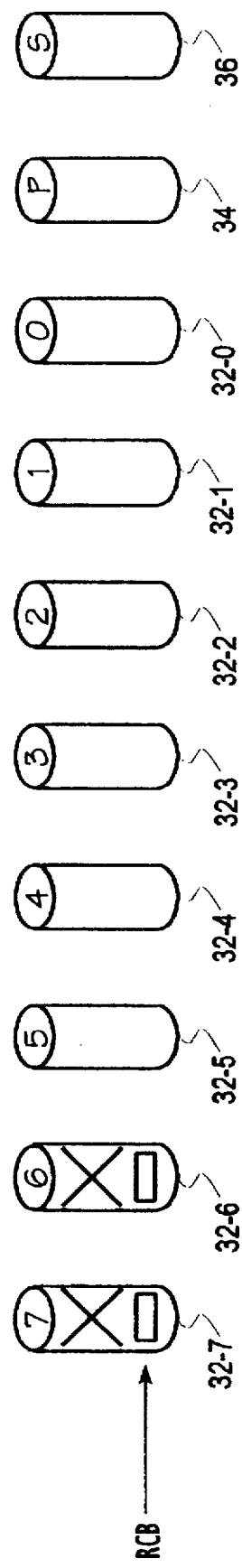
FIGS. 5B–5C illustrate the fault-tolerance of the present invention in the situation in which reconstruction occurs at the location at which data was previously written and one of the other disk drives cannot provide the necessary data for reconstruction.
Figure 5C:
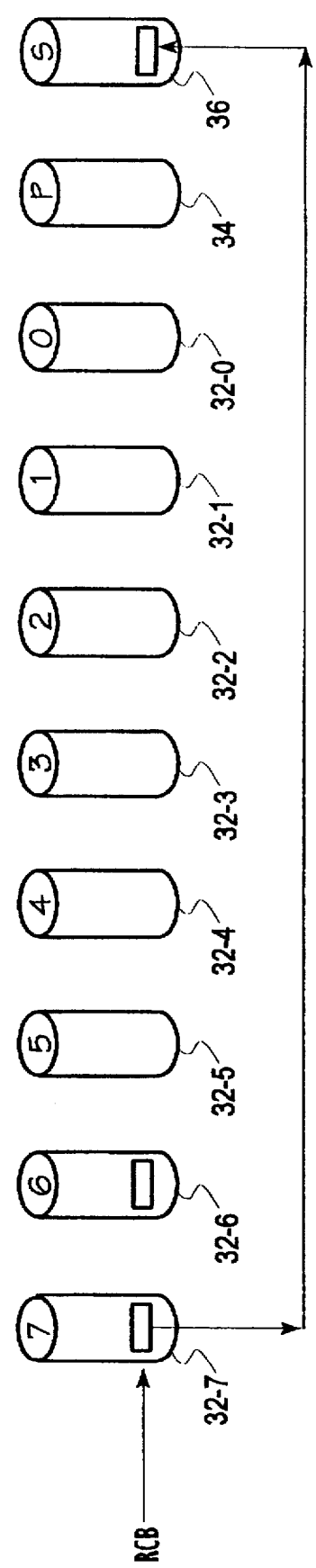

With respect to write data transfer operations in which the failed disk drive is a failed/usable disk drive and the user data is to be written to a location that follows the current reconstruction boundary in the reconstruction sequence, the ACM 28 implements the write data transfer so that the data destined for the failed/usable disk drive is still written to the failed/usable disk drive. By writing the user data to the failed/usable disk drive, fault-tolerance is attained. More specifically, fault-tolerance is attained for the situation in which, when the reconstruction process attempts to reconstruct the data in the failed/usable disk drive at which the write operation took place, one of the other disk drives that was previously in an operable state is, for some reason, incapable of providing the necessary data for reconstruction. Reconstruction for a particular unit of related data, as previously discussed, can only be accomplished if all of the other units in the group of related data from which the parity data was generated are available. FIGS. 5A–5C illustrate the fault-tolerance achieved by the ACM 28 in implementing a write data transfer during reconstruction of the data on a failed/usable disk drive in this manner. In the illustrated example, the disk drive 32-7 is in a failed/usable state, i.e., write data transfers and read data transfers can be made to the failed/usable disk drive but such transfers are inhibited. The ACM 28 implements the write data transfer so that the data destined for the failed/usable disk drive 32-7 is still written to the failed/usable disk drive 32-7 as shown in FIG. 5A. In FIG. 5B, the reconstruction process has progressed from that illustrated in FIG. 5A so that the data established by the write operation in the failed/usable disk drive 32-7 is being reconstructed. If, when this data is being reconstructed, the disk drive 32-6 is incapable of providing the data necessary for reconstruction, the reconstruction process cannot proceed. However, since a valid copy of the data exists in the failed/usable disk drive 32-7, due to the manner in which the ACM 28 conducted the write operation, this data can be copied from the failed/usable disk drive 32-7 to the spare disk drive 36 as shown in FIG. 5C. As a consequence, the reconstruction process can continue even in the presence of a fault.

Figure 6:
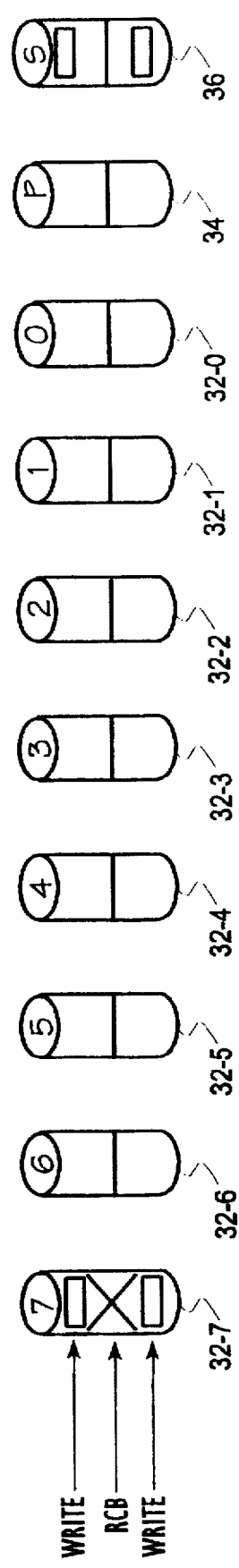
FIG. 6 illustrates a write operation during the reconstruction of data contained on a failed/usable disk drive that avoids the need to monitor the location, relative to the reconstruction boundary, at which data is written.

With respect to write data transfer operations during reconstruction of a failed/usable disk drive, the need to monitor whether the write data transfer operation occurs prior to the reconstruction boundary or after the reconstruction boundary is avoided by having the ACM 26 conduct the write data transfer operation so that data that would, under normal circumstances, be destined for the failed/usable disk drive is written to both the failed/usable disk drive and the spare disk drive 36. Stated another way, identical data is written to both the failed/usable disk drive and spare disk drive 36. An example of such a write operation is illustrated in FIG. 6. In the example illustrated in FIG. 6, the disk drive 32-7 is in a failed/usable state and its data is being reconstructed on the spare disk drive 36. The ACM 28 conducts write data transfers during the reconstruction of the failed/usable disk drive 32-7 so that identical data is written to both the failed/usable disk drive 32-7 and the spare disk drive 36 regardless of whether the transfer is before or after the reconstruction boundary. For a write data transfer prior to the reconstruction boundary, the benefits discussed with respect to the example shown in FIG. 4 are realized. Similarly, for write data transfers to locations in the disk drive array 30 after the reconstruction boundary, the benefits demonstrated with respect to FIGS. 5A–5C are realized.

Preferably, the identical data is simultaneously written to the failed/usable disk drive and the spare disk drive 36 during reconstruction of data on the failed/usable disk drive. This avoids the possibility of data not having been written to the failed/usable disk drive prior to the time at which the location at which the write is to occur is subjected to the reconstruction process and during reconstruction of this location one of the other disk drives fails to provide the necessary data for reconstruction. If this were to happen, then there would not be valid data in the failed/usable disk drive to be copied to the spare disk drive 36.

Another fault condition that is addressed by the manner in which the ACM 28 conducts write data transfer operations during the reconstruction of data on a failed/usable disk drive onto the spare disk drive 36 involves a power failure. During a power failure, the reconstruction information necessary to resume reconstruction when power is reestablished is typically lost. Consequently, if a power failure occurs during reconstruction, the reconstruction process must begin anew when power is restored. Moreover, since the reconstruction process must be restarted, all of the data on the spare disk drive 36 that had been previously reconstructed is now considered invalid since it now lies after the reconstruction boundary. By conducting write data transfers during the initial attempt at reconstruction so that the failed/usable disk drive has current data, reconstruction of the failed/usable disk drive onto the spare disk drive 36 is still possible.

Figure 7A:
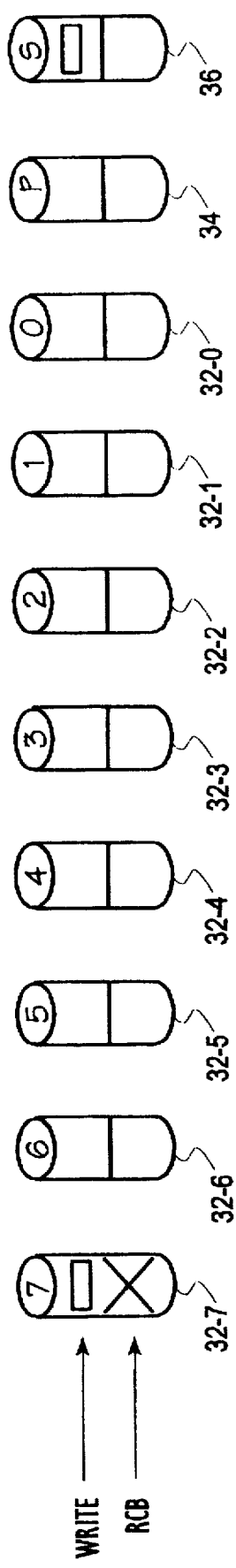

An example of the power failure scenario or fault condition is illustrated in FIGS. 7A–7C. In FIG. 7A, the ACM 28 conducts a write data transfer operation in which data is written to the disk drive array prior to the current reconstruction boundary so that identical data is substantially simultaneously written to the failed/usable disk drive 32-7 and the spare disk drive 36. Subsequently, a power failure occurs that results in the ACM 28 losing the data related to the reconstruction process and, in particular, the location of the current reconstruction boundary. Upon power being returned to the disk drive array system 24, the reconstruction process starts over from the beginning of the defined reconstruction sequence, as illustrated in FIG. 7B. As a result, all of the data established on the spare disk drive 36 during the aborted reconstruction operation is now considered invalid since it follows the new reconstruction boundary. As a consequence, the only up-to-date copy of the data established during the aborted reconstruction operation by the write data transfer operation illustrated in FIG. 7A is located in the failed/usable disk drive 32-7. When the reconstruction process progresses to the point where the data in the failed/usable disk drive 32-7 established by the write data transfer operation during the initial attempt at reconstruction is to be reconstructed, the data in the failed/usable disk drive 32-7 is available and can be used to continue the reconstruction process in the event of a fault condition. As FIG. 7C illustrates, the data in the failed/usable disk drive 32-7 is copied to the spare disk drive 36 if one of the operable disk drives 32-0 through 32-6 or the parity disk drive 34, is incapable of providing the necessary data so that the reconstruction process can continue.

Figure 8A:
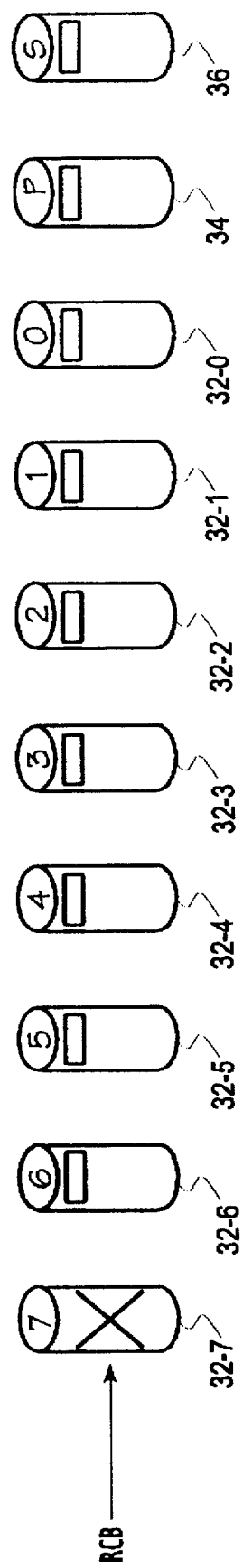
FIGS. 8A–8B illustrate read operations during reconstruction in which data is written prior to and after the reconstruction boundary, respectively.

The ACM 28 conducts read data transfer operations during the reconstruction of the data on a failed disk drive onto the spare disk drive 36 differently depending upon whether the read data transfer is before or after the reconstruction boundary and whether the disk whose data is being reconstructed is in a failed or a failed/usable state. For read data transfers prior to the reconstruction boundary and the disk drive whose data is being reconstructed is in a failed or failed/usable state, the ACM 28 conducts the read data transfer so that data is transferred from all of the disk drives in the disk drive array 30 except for the failed or failed/usable disk drive. More specifically, data is read from the operable ones of the disk drives 32-0 through 32-7 and the parity disk drive 34, and the spare disk drive 36. Since the read data transfer is at a location prior to the reconstruction boundary, the data in the spare disk drive at this location has been reconstructed and is identical to that in the failed or failed/usable disk drive. FIG. 8A illustrates an example of a read data transfer during reconstruction where the failed disk drive is the disk drive 32-7. As can be seen from FIG. 8A, the ACM 28 conducts the read data transfer operation so that the user data from the disk drives 32-0 through 32-6, the data located in spare disk drive, which is identical to that on the failed disk drive 32-7, and the parity data that is located on the parity disk drive 34 are all read.

Figure 8B:
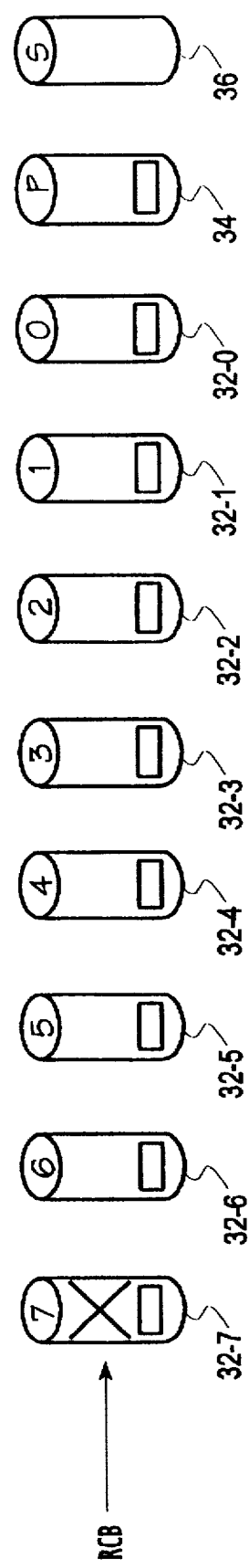

The ACM 28 conducts read data transfer operations in which data is read from a location after the reconstruction boundary and the disk drive whose data is being reconstructed is in a failed/usable state so that data is read from the operable ones of the disk drives 32-0 through 32-7 and the parity disk drive 34, and the failed one of the disk drives 32-0 through 32-7 and the parity disk drive 34. An example of a read data transfer operation of data located after the reconstruction boundary during the reconstruction of a failed/usable disk drive is illustrated in FIG. 8B. In FIG. 8B, the disk drive 32-7 is a failed/usable disk drive and the read data transfer operation results in data being read after the current reconstruction boundary. In this case, data is read from the operable disk drives 32-0 through 32-6, the failed/usable disk drive 32-7, and the parity disk drive 34. Data is not read from the spare disk drive 36 because the location from which data is being read is after the reconstruction boundary so, by definition, the data in the spare disk drive at this particular location is invalid.

As previously mentioned, after the reconstruction of a failed disk drive is complete, the failed disk drive is replaced and the data on the spare disk drive 36, i.e., the data from the failed or failed/usable disk drive, is then reconstructed on the replacement disk drive. Reconstruction of the data on the spare disk drive 36 onto the replacement disk drive for the failed or failed/usable disk drive occurs in the same manner as described with respect to the example illustrated in FIGS. 4, 5A–5C, 6, 7A–7C, and 8A–8B. In other words, the spare disk drive 36 can take the place of the failed or failed/usable disk drive 32-7 and the replacement disk drive can take the place of the spare disk drive 36 in the illustrated example. Consequently, reconstruction of data on the spare disk 36 onto the replacement disk drive for a failed or failed/usable disk drive occurs in a fashion that permits data transfers between the disk drive array system 24 and the host 22. Moreover, such data transfers are conducted in a way that achieve the previously described fault tolerance.

The foregoing description of the invention has been presented for purposes of illustration and description. Further, the description is not intended to limit the invention to the form disclosed herein. Consequently, variations and modifications commensurate with the above teachings, and the skill or knowledge in the relevant art are within the scope of the present invention. The preferred embodiment described hereinabove is further intended to explain the best mode known of practicing the invention and to enable others skilled in the art to utilize the invention in various embodiments and with the various modifications required by their particular applications or uses of the invention. It is intended that the appended claims be construed to include alternate embodiments to the extent permitted by the prior art.

What is claimed is:

1. A storage device array system that has the ability to conduct data transfers with a host system during data reconstruction, comprising:

a plurality of storage devices;

a spare storage device for use in replacing a first storage device of said plurality of storage devices when said first storage device is in a first failed state;

wherein said plurality of storage devices and said spare storage device are for storing groups of data, each group having data that are stored on different storage devices of said plurality of storage devices and said spare storage device;

array control means for controlling a write data transfer, involving a first group of data, between the storage device array system and the host system, said array control means for performing a first reconstruction of data contained in said first storage device onto said spare storage device, when said first storage device is in said first failed state, said first reconstruction including reconstruction of data at least at a reconstruction boundary that is a current location in the storage device array system at which said first reconstruction of data is occurring; and said array control means for conducting said write data transfer with the host system during said first reconstruction of data;

wherein in conducting said write data transfer, said array control means, when writing prior to said reconstruction boundary, writes data of said first group to said spare storage device and, when writing after said reconstruction boundary, writes data of said first group to said first storage device.

2. A storage device array system that has the ability to conduct data transfers with a host system during reconstruction, comprising:

a plurality of storage devices, wherein each of said plurality of storage devices is in one of the following states: an operable state in which data transfers with the host system can occur, and a failed state in which data transfers with the host system are inhibited;

a spare storage device for use in replacing a first storage device of said plurality of storage devices when said first storage device is in a first failed state, wherein said first storage device transfers data with the host system during a data transfer between said storage device array system and the host system when said first storage device is in said first failed state;

wherein said plurality of storage devices and said spare storage device are for storing groups of data, each group having data that are stored on different storage devices of said plurality of storage devices and said spare storage device; and array control means for controlling read and write transfers of data, said array control means for performing a first reconstruction of data contained in said first storage device onto said spare storage device, when said first storage device is in said first failed state and with said array control means for proceeding with said first reconstruction when one of said plurality of storage devices different from said first storage device cannot provide necessary data for said first reconstruction; and for conducting said data transfer with the host system during said first reconstruction of data.

3. A storage device array system, as claimed in claim 2, wherein:

said array control means copies data from said first storage device to said spare storage device.

4. A storage device array system that has the ability to conduct data transfers with a host system during data reconstruction, comprising:

a plurality of storage devices;

a spare storage device for use in replacing a first storage device of said plurality of storage devices when said first storage device is in a first failed state;

wherein said plurality of storage devices and said spare storage device are for storing groups of data, each group having data that are stored on different storage devices of said plurality of storage devices and said spare storage device; and array control means for controlling A read data transfer between the storage device array system and the host system, said array control means far performing a first reconstruction of data contained in said first storage device onto said spare storage device, when said first storage device is in said first failed state, said first reconstruction including reconstruction of data at least at a reconstruction boundary that is a current location in the storage device array system at which said first reconstruction of data is occurring; and said array control lamp for conducting said read data transfer with the host system during said first reconstruction of data;

wherein, in conducting said read data transfer, said array control means reads data following said reconstruction boundary from said first storage device and other of said plurality of storage devices in addition to said first storage device.

5. A storage device array system, as claimed in claim 4, wherein:

said array control means reads data prior to said reconstruction boundary from said spare storage device and other of said plurality of storage devices different from said first storage device.

6. A storage device array system having fault-tolerance and being subject to a first predetermined condition related to its operation, comprising:

a plurality of storage devices, wherein each of said plurality of storage devices is in one of the following states: an operable state in which data can be written to and read from the each storage device by a host system, and a failed state in which data can be written to, and read from, the each storage device by the host system but such operation is inhibited;

a spare storage device for use in replacing a first storage device of said plurality of storage devices that is in the failed state;

wherein said plurality of storage devices and said spare storage device are for storing groups of data, each group having data that are stored on different devices of said plurality of storage devices and said spare storage device; and array control means for controlling a reading by the host system of data from and a writing by the host system of data to said plurality of storage devices and said spare storage device, said array control means for performing a first reconstruction of data contained in said first storage device onto said spare storage device when said first storage device is in the failed state using data from said plurality of storage devices different from said first storage device; and for writing data from the host system to said plurality of storage devices during said first reconstruction;

wherein, when a second of said plurality of storage devices is incapable of providing necessary data for said first reconstruction, said first reconstruction proceeds when at least said first predetermined condition exists.

7. A storage device array system having fault-tolerance, as claimed in claim 6, wherein:

said first predetermined condition includes data from said first storage device being able to be used for said first reconstruction.

8. A storage device array system having fault-tolerance as claimed in claim 6, wherein:

said array control means causes identical data to be written from the host system to said first storage device and said spare storage device during said first reconstruction.

9. A storage device array system having fault-tolerance, as claimed in claim 6, wherein:

said array control means copies data from said first storage device to said spare storage device in the event that said second storage device of said plurality of storage devices is incapable of providing necessary data for said first reconstruction.

10. A storage device array system having fault-tolerance, as claimed in claim 6, wherein:

said array control means reconstructs first data contained in said spare storage device on a replacement storage device for said first storage device, said first data provided on said spare storage device from said first storage device during said first reconstruction.

11. A method for use in conducting data transfers between a storage device array system and a host system during reconstruction in the storage device array system, comprising:

providing a plurality of storage devices, wherein each of said plurality of storage devices is in one of the following states: an operable state in which data transfers can occur and a failed state in which data transfers are inhibited;

providing a spare storage device for use in replacing a first storage device of said plurality of storage devices when said first storage device is in a first failed state, wherein said first storage device transfers data with the host system during a read data transfer and a write data transfer between the storage device array system and the host system when said first storage device is in said first failed state and said first storage device having boundary information;

wherein both said plurality of storage devices and said spare storage device are included in the storage device array system, said storage device array system for storing groups of data, each group having data that are stored on different storage devices of said plurality of storage devices and said spare storage device;

reconstructing data contained in said first storage device of said plurality of storage devices that is in said first failed state on said spare storage device; and transferring data between said storage device array system and the host system before said step of reconstructing is completed to said storage device array system without utilizing said boundary information related to said step of reconstructing;

wherein a predetermined duration related to at least one of said step of reconstructing and said step of transferring is used for determining when to switch between: (a) operations for performing said step of reconstructing; and (b) operations for performing said step of transferring.

12. A method for providing write access, by a host system, to a storage device array during reconstruction of a failed storage device onto a spare storage device that provides fault-tolerance comprising:

providing a plurality of storage devices, wherein each of said plurality of storage devices is in one of the following states: an operable state in which data can be written to, and read from, the storage device, and a failed state in which data can be written to, and read from, the storage device but such operation is inhibited;

providing a spare storage device for use in replacing one of said plurality of storage devices that is in the failed state;

wherein both said plurality of storage devices and said spare storage device are included in the storage device array, said storage device array for storing groups of data, each group having data that are stored on different storage devices of said plurality of storage devices and said spare storage device;

reconstructing the data contained in a first storage device of said plurality of storage devices that is in the failed state on said spare storage device using other of said plurality of storage devices; and writing data to said storage device array from the host system during said step of reconstructing;

wherein said step of reconstructing data in said first storage device on said spare storage device proceeds, by copying data from said first storage device to said spare storage device, when a second storage device of said plurality of storage devices is incapable of providing data for said step of reconstructing.

13. A method, as claimed in claim 12, wherein:

said step of writing includes writing, from the host system, identical data to said first storage device and said spare storage device.

14. A method, as claimed in claim 37, wherein:

said step of writing includes copying said identical data from said first storage device to said spare storage device in the event a second storage device of said plurality of storage devices is incapable of providing necessary data for said step of reconstructing.

15. A storage device array system that has the ability to conduct data transfers with a host during reconstruction, comprising:

a plurality of storage devices, including first and second storage devices, for storing groups of data units, each group having data units stored on different storage devices of said plurality of storage devices, each group of data redundantly encoded such that, in an absence of error, a subcollection of said plurality of storage devices is sufficient for transferring data corresponding to the group of data to said host;

a spare storage device, different from said plurality of storage devices, for use in replacing said first storage device of said plurality of storage devices, a storage device array including said spare storage device and said plurality of storage devices;

wherein from a first plurality of said data groups, a first plurality of said data units, including a first data unit and a second data unit, stored on said first storage device is reconstructed on said spare storage device, in a first reconstruction, when said first storage device is in a failed state in which data transfers with the host are inhibited; and array control means for controlling transfers of data between said storage device array and the host said array control means;

(i) for performing said first reconstruction, said first data unit being reconstructed before said second data unit;

(ii) for conducting a first transfer of data between said storage device array system and the host wherein said first transfer of data occurs between reconstruction of said first data unit and reconstruction of said second data unit during said first reconstruction; and (iii) for proceeding with said first reconstruction by using data from said first storage device and not using data from said second storage device.

16. A storage device array system, as claimed in claim 15, wherein:

said array control means reconstructs data contained in said spare storage device, which is data from said first storage device, on a replacement storage device for said first storage device.

17. A storage device array system, as claimed in claim 15, wherein:

said array control means conducts a write data transfer and conducts a read data transfer between said storage device array and the host.

18. A storage device array system, as claimed in claim 15, wherein:

said failed state includes the ability of said first storage device to accomplish at least a read data transfer to the host.

19. A storage device array system, as claimed in claim 18, wherein:

said failed state includes the ability of said first storage device to accomplish a read data transfer and a write data transfer with the host.

20. A storage device array system, as claimed in claim 19, wherein:

said array control means writes data from the host to said storage device array.

21. A storage device array system, as claimed in claim 20, wherein:

said array control means writes identical data from the host to said first storage device and said spare storage device.

22. A storage device array system, as claimed in claim 20, wherein:

said array control means writes identical data from the host to said first storage device and said spare storage device at substantially the same time.

23. A storage device array system, as claimed in claim 19, wherein:

said array control means reads data from said storage device array to the host.

24. A storage device array system, as claimed in claim 15, wherein:

said array control means writes data from the host to said spare storage device prior to a reconstruction boundary.

25. A storage device array, as claimed in claim 15, wherein:

said array control means uses data from other of said plurality of storage devices different from said first storage device to reconstruct data contained in said first storage device onto said spare storage device.

26. A storage device array system, as claimed in claim 15, wherein:

said plurality of storage devices includes one of the following: a disk drive and a tape drive.

27. A storage device array system, as claimed in claim 15, wherein:

said pluraity of storage devices includes a parity storage device for containing parity data on data stored in said storage device array.

28. A storage device array system as claimed in claim 15, wherein:

said array control means defines the direction of at least one of the following: operations relating to said first reconstruction and operations relating to data transfers.

29. A storage device array system, as claimed in claim 15, wherein:

said array control means copies data from said first storage device to said spare storage device.

30. A storage device array system, as claimed in claim 15, wherein:

said array control means provides data to the host during said first reconstruction wherein data provided from after a reconstruction boundary is provided by said first storage device and other of said plurality of storage devices different from said first storage device, said reconstruction boundary defining a storage location in said first storage device prior to which said first reconstruction has been accomplished and after which said first reconstruction has not been accomplished.

31. A method for conducting data transfers with a host during reconstruction in a storage device array system, comprising:

providing a plurality of storage devices for storing groups having data units, said data units of each group are stored on different storage devices of said plurality of storage devices, the each group having data units redundantly encoded such that, in an absence of error, a subcollection of said plurality of storage devices is sufficient for transferring data corresponding to the each group of data units to the host;

providing a spare storage device, different from said plurality of storage devices, for use in replacing a first storage device of said plurality of storage devices, wherein a storage device array includes said plurality of storage devices and said spare storage device;

reconstructing a first plurality of data units from said first storage device of said plurality of storage devices on said spare storage device when said first storage device is in a failed state in which data transfers with the host are inhibited, said first plurality of data units included in a first plurality of data groups;

accessing said first plurality of data units on said spare storage device after said step of reconstructing for a host initiated data transfer request which results in transferring data corresponding to said first plurality of data groups between:

(i) a set of storage devices including said spare storage device and including storage devices of said storage device array excluding said first storage device; and (ii) the host;

wherein said storage devices of said set of storage devices substantially simultaneously read or write said first plurality of data groups in fulfilling the host initiated data transfer request;

transferring data corresponding to said first plurality of data groups between said storage device array and the host during said step of reconstructing;

wherein a data location in each of said first storage device and said spare storage device is accessed during said step of transferring when said step of transferring includes a write to said storage device array from the host.

32. A method, as claimed in claim 31, wherein:

said step of reconstructing includes reconstructing data contained in said spare storage device, which is data from said first storage device, on a replacement storage device for said first storage device.

33. A method, as claimed in claim 32, wherein:

said step of reconstructing includes copying data from said first storage device to said spare storage device in the event one of said plurality of storage devices is incapable of providing data that is necessary for reconstruction.

34. A method, as claimed in claim 31, wherein:

said step of transferring includes at least one of the following: writing data from the host to said storage device array and reading data by the host from said storage device array.

35. A method, as claimed in claim 31, wherein:

said failed state includes an ability by said first storage device to perform a read data transfer and a write data transfer with the host.

36. A method, as claimed in claim 31, wherein:

said step of transferring includes writing data to said storage device array from the host.

37. A method, as claimed in claim 36, wherein:

said step of reconstructing is conducted without monitoring storage locations associated with data being written to said storage device array from the host during said step of writing.

38. A method, as claimed in claim 31, wherein:

said step of transferring includes writing identical data from the host to said first storage device and said spare storage device.

* * * * *